US012424462B2

(12) United States Patent
Karasawa et al.

(10) Patent No.: US 12,424,462 B2
(45) Date of Patent: Sep. 23, 2025

(54) INFORMATION PROCESSING SYSTEM, TEMPERATURE CONTROL METHOD, AND HEAT TREATMENT APPARATUS

(71) Applicant: Tokyo Electron Limited, Tokyo (JP)

(72) Inventors: Hiroyuki Karasawa, Yamanashi (JP); Masakazu Yamamoto, Iwate (JP); Tadashi Enomoto, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 506 days.

(21) Appl. No.: 17/659,514

(22) Filed: Apr. 18, 2022

(65) Prior Publication Data
US 2022/0344180 A1 Oct. 27, 2022

(30) Foreign Application Priority Data

Apr. 26, 2021 (JP) ................................. 2021-074121

(51) Int. Cl.
H01L 21/67 (2006.01)
(52) U.S. Cl.
CPC .. *H01L 21/67109* (2013.01); *H01L 21/67248* (2013.01)
(58) Field of Classification Search
CPC ......... H01L 21/67248; H01L 21/67757; H01L 21/67303
See application file for complete search history.

(56) References Cited

U.S. PATENT DOCUMENTS

| 2002/0055080 A1* | 5/2002 | Tanaka | C23C 16/46 432/128 |
| 2005/0247266 A1* | 11/2005 | Patel | C23C 16/345 118/724 |
| 2018/0082826 A1* | 3/2018 | Guha | H01J 37/32082 |

FOREIGN PATENT DOCUMENTS

| JP | H01-309318 | 12/1989 |
| JP | 2000-058466 | 2/2000 |
| JP | 2005-026397 | 1/2005 |
| JP | 2012-222036 | 11/2012 |
| JP | 2013-161857 | 8/2013 |

* cited by examiner

*Primary Examiner* — Joseph A Miller, Jr.
(74) *Attorney, Agent, or Firm* — IPUSA, PLLC

(57) ABSTRACT

An information processing system includes a temperature measuring unit configured to measure a temperature distribution, in an array direction of substrates to be treated, at positions between a heater and the substrates in a treatment chamber, a memory, and a processor coupled to the memory and configured to perform a simulation of the temperature distribution during performing the heat treatment on the substrates in the treatment chamber, to obtain a standard-simulation temperature distribution by using a standard-simulation model of the heat treatment apparatus, modify the standard-simulation model to obtain an individual-simulation model in which an individual difference of the heat treatment apparatus is reflected, based on a difference between the measured temperature distribution and the obtained standard-simulation temperature distribution, perform the simulation of the temperature distribution to obtain an individual-simulation temperature distribution by using the obtained individual-simulation model, and correct a target temperature by using the obtained individual-simulation temperature distribution.

8 Claims, 16 Drawing Sheets

POSITION OF POST-INSTALLATION TEMPERATURE SENSOR Aaf

INDIVIDUAL SIMULATION MODEL

↔ : MODELED HEAT EXCHANGE
↔ : MODIFIED EXCHANGE

POST-INSTALLATION TEMPERATURE SENSOR Aaf

HEAT TREATMENT APPARATUS (ACTUAL APPARATUS)

INFORMATION PROCESSING SYSTEM, TEMPERATURE CONTROL METHOD, AND HEAT TREATMENT APPARATUS

CROSS-REFERENCE TO RELATED APPLICATIONS

This patent application is based on and claims priority to Japanese Patent Application No. 2021-074121 filed on Apr. 26, 2021, the entire contents of which are incorporated herein by reference.

TECHNICAL FIELD

The present disclosure relates to an information processing system, a temperature control method, and a heat treatment apparatus.

BACKGROUND

A heat treatment apparatus is used, for example, in the manufacture of semiconductor devices. The heat treatment apparatus accommodates a wafer to be treated in a process tube and performs a predetermined heat treatment on the wafer by heating with a cylindrical heater coaxially disposed in the external air surrounding the process tube. In order to perform a uniform in-plane heat treatment to all wafers of different installation positions in the process tube, it is required to form a uniform thermal region having a constant temperature distribution within the process tube.

In related heat treatment apparatuses, temperature sensors are provided at predetermined locations within the process tube to compare output values of the temperature sensors with desired output values of the respective temperature sensors that are obtained when a predetermined uniform thermal region is formed within the process tube. Related heat treatment apparatuses use a computer to control a heating method of a heater so that the output values of the temperature sensors during the actual heat treatment are close to predetermined ideal output values.

Related heat treatment apparatuses can only measure temperatures at multiple positions in the process tube where the temperature sensors are provided. Thus, there is a heat treatment apparatus that includes a temperature measuring element provided to be movable in a wafer array direction in the process tube and that continuously measures a temperature distribution while moving the temperature measuring element (see, for example, Patent Document 1).

RELATED ART DOCUMENT

Patent Document

[Patent Document 1] Japanese Laid-open Patent Application Publication No. 1-309318

SUMMARY

With respect to an information processing system including a heater configured to heat substrates to be treated, a heat treatment apparatus configured to perform heat treatment on the substrates to be treated in a treatment chamber, and an information processing device configured to output a target temperature to be used to control the heater, the information processing system includes a temperature measuring unit configured to measure a temperature distribution, in an array direction of the substrates to be treated, at positions between the heater and the substrates to be treated in the treatment chamber, a memory, and a processor coupled to the memory and configured to perform a simulation of the temperature distribution during performing the heat treatment on the substrates to be treated in the treatment chamber, to obtain a standard simulation temperature distribution by using a standard simulation model of the heat treatment apparatus, modify the standard simulation model to obtain an individual simulation model in which an individual difference of the heat treatment apparatus is reflected, based on a difference between the measured temperature distribution and the obtained standard simulation temperature distribution, perform the simulation of the temperature distribution during performing the heat treatment on the substrates to be treated in the treatment chamber, to obtain an individual simulation temperature distribution by using the obtained individual simulation model, and correct the target temperature by using the obtained individual temperature distribution.

According to at least one embodiment of the present disclosure, by using a simulation model, the uniformity of a temperature distribution in a treatment chamber during a heat treatment of a substrate to be treated can be improved.

DETAILED DESCRIPTION OF EMBODIMENTS

The present disclosure provides a technique that improves the uniformity of a temperature distribution in a treatment chamber during performing a heat treatment of a substrate to be treated, by using a simulation model.

In the following, embodiments of the present disclosure will be described with reference to the drawings.

First Embodiment

Figure 1:
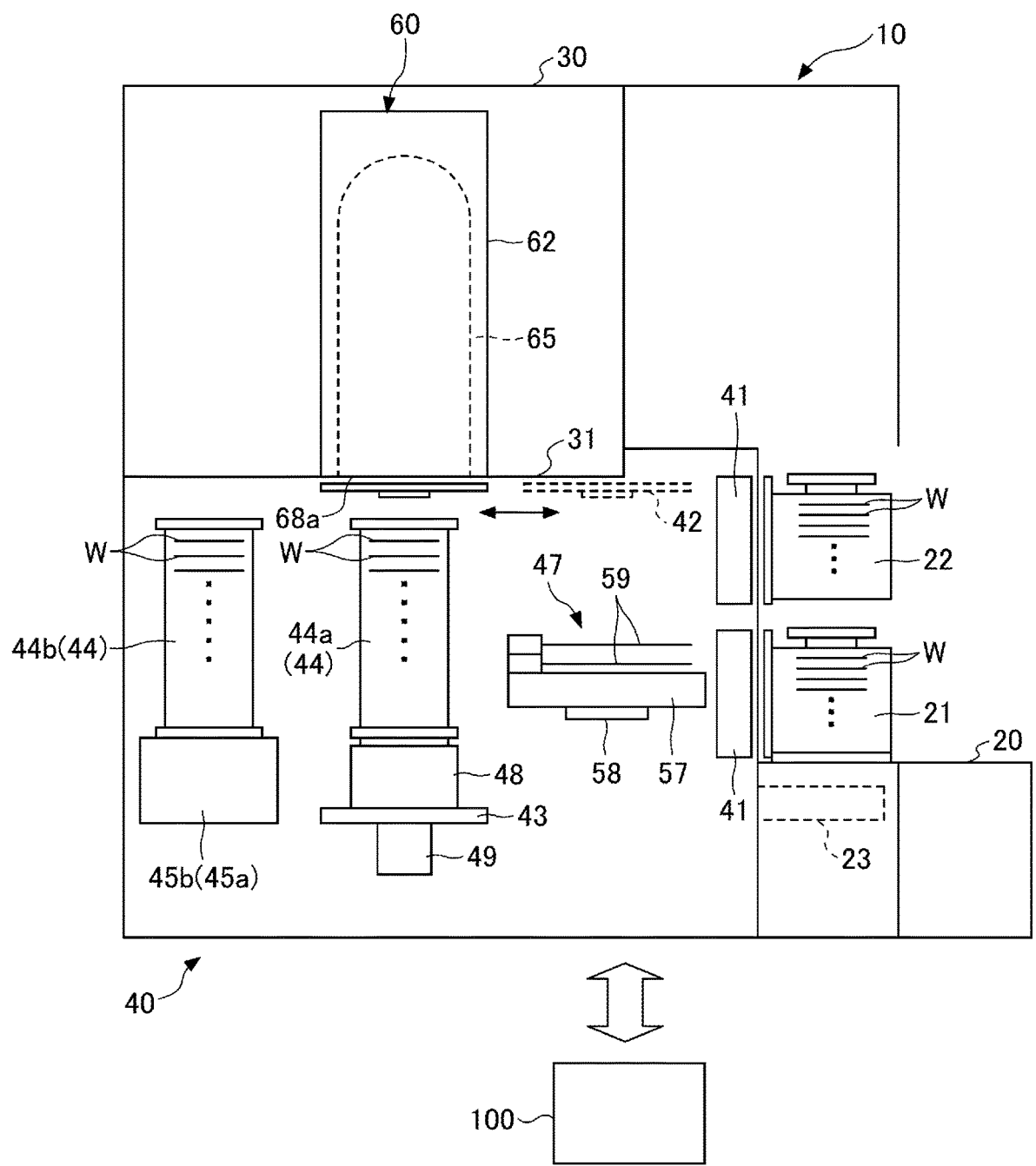
FIG. 1 is a longitudinal cross-sectional view schematically illustrating a heat treatment apparatus according to the present embodiment.
Figure 2:
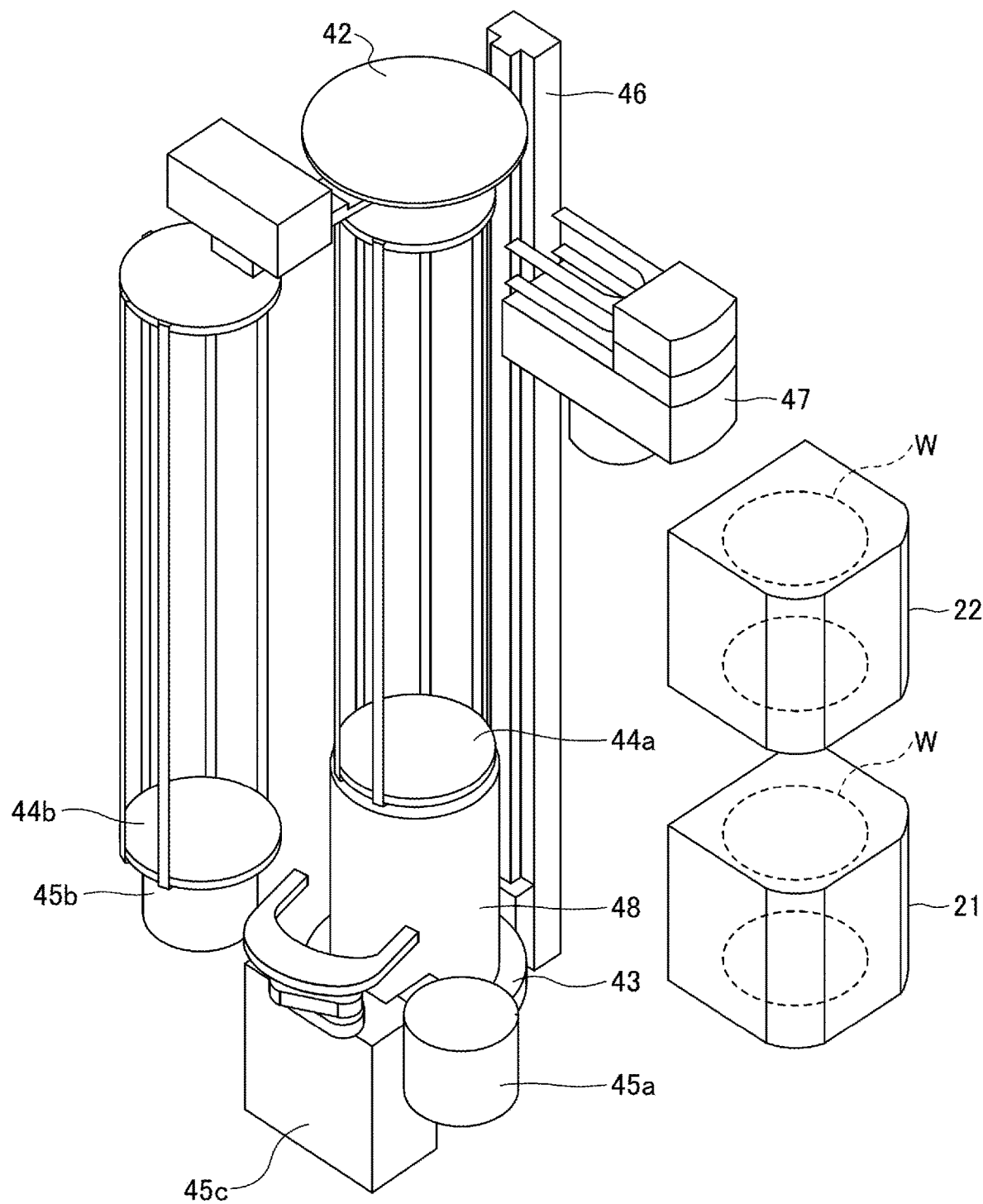
FIG. 2 is a perspective view schematically illustrating a loading area.
Figure 3:
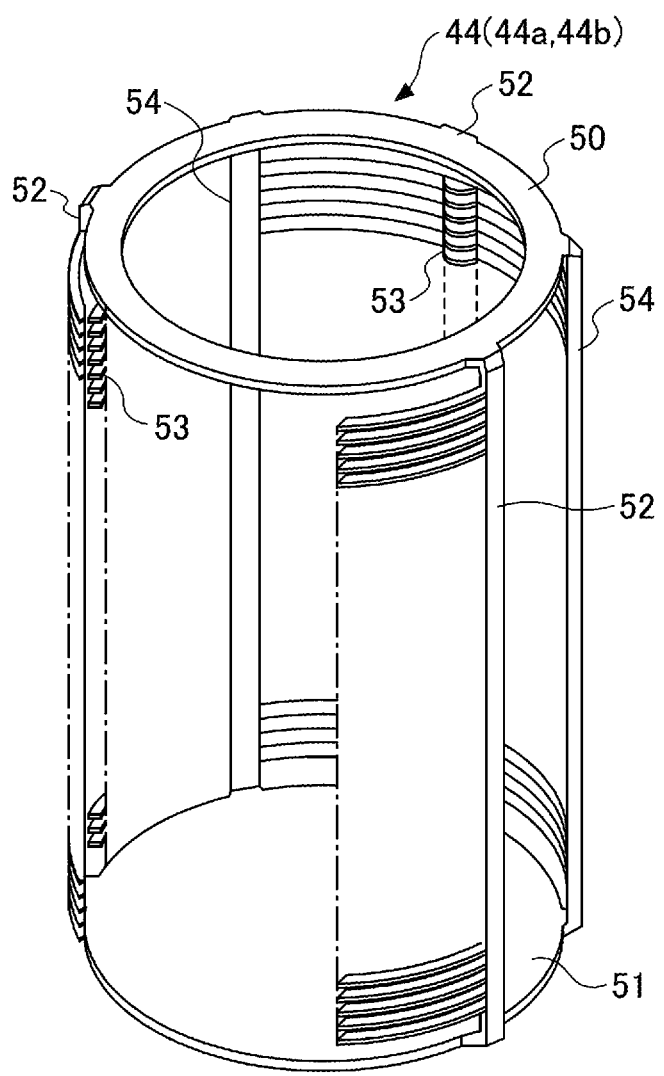
FIG. 3 is a perspective view schematically illustrating an example of a boat.

FIG. 1 is a longitudinal cross-sectional view schematically illustrating a heat treatment apparatus according to the present embodiment. FIG. 2 is a perspective view schematically illustrating a loading area. FIG. 3 is a perspective view schematically illustrating an example of a boat.

A heat treatment apparatus 10 includes a vertical heat treatment furnace 60, which will be described later, and can hold and accommodate multiple wafers W along a longitudinal direction of the boat at predetermined intervals, and can perform various heat treatments, such as oxidation, diffusion, and decompression CVD, on the wafers W. Hereinafter, an example of a heat treatment apparatus that performs the oxidation treatment on a surface of the wafer W by supplying a process gas formed of, for example, water vapor, to the wafers W installed in a treatment chamber 65, which will be described later, will be described. The wafer W is an example of the substrate to be treated. The substrate to be treated is not limited to a circular wafer W.

The heat treatment apparatus 10 of FIG. 1 includes a stage (load port) 20, a housing 30, and a controller 100. The stage (load port) 20 is provided at a front portion of the housing 30. The housing 30 includes a loading area (working area) 40 and a heat treatment furnace 60.

The loading area 40 is provided below within the housing 30. The heat treatment furnace 60 is located within the housing 30 and is located above the loading area 40. Additionally, a base plate 31 is provided between the loading area 40 and the heat treatment furnace 60.

The stage (load port) 20 is used to carry in the wafer W into the housing 30 and carry out the wafer W from the housing 30. Containers 21 and 22 are mounted on the stage (load port) 20. The containers 21 and 22 are sealed containers (FOUPs) with a removably mounted lid at the front (not illustrated), each of which allows multiple wafers W (e.g., about 25 wafers) to be accommodated at predetermined intervals.

Additionally, an aligner 23 may be provided below the stage 20 to align, in one direction, cutouts (for example, notches) provided at the outer peripheries of the wafers W transferred by a transfer mechanism 47, which will be described later.

The loading area (work area) 40 is used to transfer the wafer W between the containers 21 and 22; and a boat 44 to carry in (load) the boat 44 into the treatment chamber 65 and carry out (unload) the boat 44 from the treatment chamber 65. In the loading area 40, a door mechanism 41, a shutter mechanism 42, a lid 43, the boat 44, a base 45a, a base 45b, a lift mechanism 46, and a transfer mechanism 47 are provided.

The door mechanism 41 removes the lids of the containers 21 and 22 and opens the containers 21 and 22 to connect the inside of the containers 21 and 22 to the loading area 40. The shutter mechanism 42 is provided above in the loading area 40. The shutter mechanism 42 is provided to cover (or block) a furnace port 68a, which will be described later, to suppress or prevent heat in a high-temperature furnace from being released into the loading area 40 from the furnace port 68a when the lid 43 is opened.

The lid 43 includes a heat insulating cylinder 48 and a rotation mechanism 49. The heat insulating cylinder 48 is provided on the lid 43. The heat insulating cylinder 48 prevents the boat 44 from being cooled by heat transfer toward the lid 43 and maintains the temperature of the boat 44. The rotation mechanism 49 is attached to a lower portion of the lid 43. The rotation mechanism 49 is for rotating the boat 44. The rotation axis of the rotation mechanism 49 is provided to hermetically penetrate the lid 43 and rotate a rotation table (not illustrated) disposed on the lid 43.

The lift mechanism 46 drives the lid 43 to move up and down when the boat 44 is carried in and out between the loading area 40 and the treatment chamber 65. The lid 43 is provided to contact the furnace port 68a to hermetically seal the furnace port 68a when the lid 43 raised by the lift mechanism 46 is carried into the treatment chamber 65. The boat 44 mounted on the lid 43 can rotatably hold the wafer W in a horizontal plane within the treatment chamber 65.

Here, the heat treatment apparatus 10 may include multiple boats 44. An example of having two boats 44 will be described in the present embodiment with reference to FIG. 2.

In the loading area 40, boats 44a and 44b are provided. In the loading area 40, a base 45a, a base 45b, and a boat transfer mechanism 45c are provided. The bases 45a and 45b are stages on which the boats 44a and 44b are respectively transferred from the lid 43. The boat transfer mechanism 45c is for transferring the boat 44a or 44b from the lid 43 to the base 45a or 45b.

The boats 44a and 44b are made, for example, of quartz, and are used to horizontally mount the wafer W having a large diameter, for example, a 300 mm diameter, at predetermined intervals (pitch widths) in the up and down direction. The boats 44a and 44b, for example, are formed by multiple (e.g., three) supports 52 being interposed between a top plate 50 and a bottom plate 51, as illustrated in FIG. 3. The support 52 is provided with a claw 53 for holding the wafer W. Additionally, auxiliary supports 54 are suitably provided in the boats 44a and 44b together with the supports 52.

The transfer mechanism 47 is used to transfer the wafer W between the container 21 or 22 and the boat 44a or 44b. The transfer mechanism 47 includes a base 57, a lift arm 58, and multiple forks (transfer plates) 59. The base 57 is configured to lift and to turn. The lift arm 58 is configured to move in the vertical direction (lift) by ball screws or the like. The base 57 is configured to turn in a horizontal direction relative to the lift arm 58.

Figure 4:
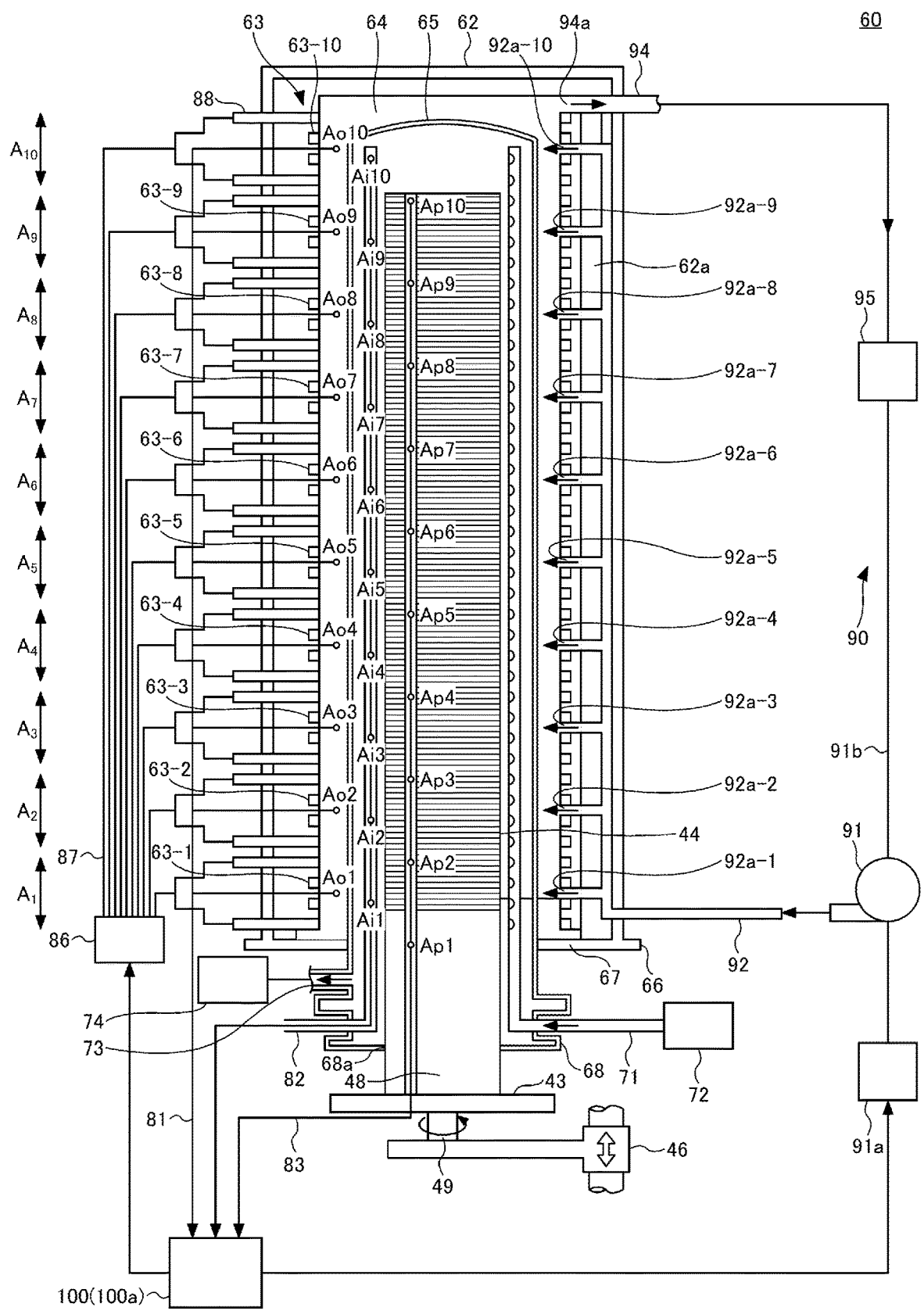
FIG. 4 is a cross-sectional view schematically illustrating a configuration of a heat treatment furnace.

FIG. 4 is a cross-sectional view schematically illustrating a configuration of the heat treatment furnace. The heat treatment furnace 60 of FIG. 4 is an example of a vertical furnace that accommodates multiple sheet-shaped wafers W and performs a predetermined heat treatment. The heat treatment furnace 60 includes a jacket 62, a heater 63, a space 64, and a treatment chamber 65.

The treatment chamber 65 is for accommodating the wafer W held in the boat 44 and performing the heat treatment. The treatment chamber 65 is made, for example, of quartz, and has a longitudinal shape. The treatment chamber 65 is supported on a base plate 66 through a lower manifold 68. A process gas is supplied from the manifold 68 to the treatment chamber 65 through an injector 71. The injector 71 is connected to a gas source 72. Additionally, a process gas and purge gas supplied to the treatment chamber 65 are evacuated through an outlet 73 by an exhaust system 74 including a vacuum pump that can control decompression.

The lid 43 closes the furnace port 68a below the manifold 68 when the boat 44 is carried into the treatment chamber 65. The lid 43 is configured to move up and down by the lift mechanism 46. The heat insulating cylinder 48 is mounted on an upper portion of the lid 43. On an upper portion of the heat insulating cylinder 48, the boat 44 mounting a number of wafers W in the vertical direction at predetermined intervals is provided.

The jacket 62 is provided to cover the surrounding of the treatment chamber 65 and defines a space 64 around the treatment chamber 65. The jacket 62 has a cylindrical shape, as with the treatment chamber 65. The jacket 62 is supported by the base plate 66. Inside the jacket 62 and outside the space 64, an insulating material 62a made of glass wool may be provided, for example.

The heater 63 is provided to cover the surrounding of the treatment chamber 65, heats the treatment chamber 65, and heats the wafer W held in the boat 44, i.e., an object to be heated in the treatment chamber 65. The heater 63 is provided inside the jacket 62 and outside the space 64. The heater 63 is formed by a heat generating resistor, such as carbon wire, and can control the temperature of the gas flowing through the interior of the space 64 and can control the temperature of the treatment chamber 65 to be a predetermined temperature (e.g., 50° C. to 1200° C.). The heater 63 functions as a heater that heats the treatment chamber 65 and the wafer W.

The space 64 and a space in the treatment chamber 65 are divided along the vertical direction into multiple unit regions, e.g., 10 unit regions A1, A2, A3, A4, A5, A6, A7, A8, A9, and A10. The heater 63 is divided into heaters 63-1, 63-2, 63-3, 63-4, 63-5, 63-6, 63-7, 63-8, 63-9, and 63-10, which respectively correspond to the unit regions along the vertical direction. Each of the heaters 63-1 through 63-10 is configured to independently control the output to a corresponding one of the unit regions A1 through A10, for example, by a heater output unit 86 including a thyristor. The heaters 63-1 through 63-10 are examples of heating elements.

Here, in FIG. 4, an example in which the space 64 and the space in the treatment chamber 65 are divided into 10 unit regions along the vertical direction is illustrated. The number of divisions of the unit regions is not limited to 10, and the space 64 and the space in the treatment chamber 65 may be divided by a number other than 10. Additionally, in FIG. 4, the space 64 and the space in the treatment chamber 65 are evenly divided, but the division form is not limited to this. An area close to the furnace port 68a having a large temperature change may be divided into fine regions. As long as the heaters 63 are provided in different positions along the vertical direction, the heater 63 is not required to correspond to the unit regions A1 to A10.

In the space 64, heater temperature sensors Ao1 to Ao10 that measure temperatures respectively corresponding to the unit regions A1-A10 are provided. Additionally, in the space inside the treatment chamber 65, in-chamber temperature sensors Ai1-Ai10 that measure temperatures respectively corresponding to the unit regions A1-A10 are provided. The heater temperature sensors Ao1-Ao10 and the in-chamber temperature sensors Ai1-Ai10 measure temperatures to measure a temperature distribution along the vertical direction. The in-chamber temperature sensors Ai1 to Ai10 are examples of first temperature measuring units that measure a temperature distribution in the wafer array direction with multiple temperature measuring elements provided in the heat treatment apparatus 10 in advance.

Measurement signals from the heater temperature sensors Ao1 to Ao10 are input to a controller 100 through a line 81. Measurement signals from the in-chamber temperature sensors Ai1 to Ai10 are input to the controller 100 through a line 82. The controller 100, to which the measurement signals are input, calculates a setting value for controlling an amount of heat generation of the heaters 63-1 to 63-10 based on a target temperature, which will be described later, and outputs the calculated setting value to the heater output unit 86.

The heater output unit 86 outputs the setting value input by the controller 100 to each of the heaters 63-1 to 63-10 through a heater output line 87 and a heater terminal 88. By calculating the setting value of the heater output unit 86, for example, by PID control, the controller 100 controls the output from the heater output unit 86 to each of the heaters 63-1 to 63-10, that is, the amount of heat generation of each of the heaters 63-1 to 63-10.

Here, as illustrated in FIG. 4, the heat treatment apparatus 10 may be provided with movable temperature sensors Ap1 to Ap10 that are loaded and unloaded with the wafer W. Measurement signals from the movable temperature sensors Ap1 to Ap10 are input to the controller 100 through a line 83.

Additionally, the heat treatment apparatus 10 according to the present embodiment uses multiple post-installation temperature sensors that can be provided in the space inside the treatment chamber 65 at a later time, and that can be removed. The post-installation temperature sensors measure the temperatures to obtain a temperature distribution along the vertical direction, as with the in-chamber temperature sensors Ai1 to Ai10. Here, the post-installation temperature sensors are examples of second temperature measuring units that measure a temperature distribution in the wafer array direction with multiple temperature measuring elements provided to the heat treatment apparatus 10 at a later time. Measurement signals from the post-installation temperature sensor are input to the controller 100 through a line.

The heater temperature sensors Ao, the in-chamber temperature sensors Ai, the movable temperature sensors Ap, and the post-installation temperature sensors may be provided at locations where a temperature distribution along the vertical direction in the treatment chamber 65 can be measured. For example, the heater temperature sensors Ao, the in-chamber temperature sensors Ai, the movable temperature sensors Ap, and the post-installation temperature sensors are not required to be respectively provided to the unit regions A1-A10.

Additionally, the heat treatment furnace 60 may include a cooling mechanism 90 that cools the treatment chamber 65. The cooling mechanism 90 may include, for example, a blower 91, a blow tube 92, and an exhaust tube 94.

The blower 91 cools the treatment chamber 65 by blowing, for example, a cooling gas made of air, into the space 64 in which the heaters 63 are provided. The blow tube 92 is for supplying the cooling gas from the blower 91 to the heater 63. The blow tube 92 is connected to each of injection holes 92a-1 to 92a-10 to supply the cooling gas to the space 64.

The exhaust tube 94 is for exhausting air in the space 64. In the space 64, an outlet 94a for exhausting the cooling gas from the space 64 is provided. One end of the exhaust tube 94 is connected to the outlet 94a.

Additionally, as illustrated in FIG. 4, in the heat treatment furnace 60, a heat exchanger 95 may be provided in the middle of the exhaust tube 94 and the other end of the exhaust tube 94 may be connected to the suction side of the blower 91. The cooling gas exhausted by the exhaust tube 94 may be returned to the blower 91 and circulated for use, after the heat exchanger 95 exchanges heat, without being exhausted to the factory exhaust system. In this case, the cooling gas may be circulated through an air filter (not illustrated). Alternatively, the cooling gas discharged from the space 64 may be exhausted from the exhaust tube 94 to the factory exhaust system through the heat exchanger 95.

The blower 91 may be configured to control the air flow rate of the blower 91 by controlling the power supplied from a power supply 91a including, for example, an inverter, based on an output signal from the controller 100.

The controller 100 is implemented, for example, by a computer 500, which will be described later. The controller 100 reads a program recorded in a storage device and transmits control signals to respective units constituting the heat treatment apparatus 10 according to the program to perform the heat treatment. The controller 100 controls the temperature in the treatment chamber 65 by controlling the power to be supplied to the heater 63 based on the measurement signals (signals indicating the measurement temperature) measured by the heater temperature sensors Ao, the in-chamber temperature sensors Ai, the movable temperature sensors Ap, and the post-installation temperature sensors.

Figure 5:
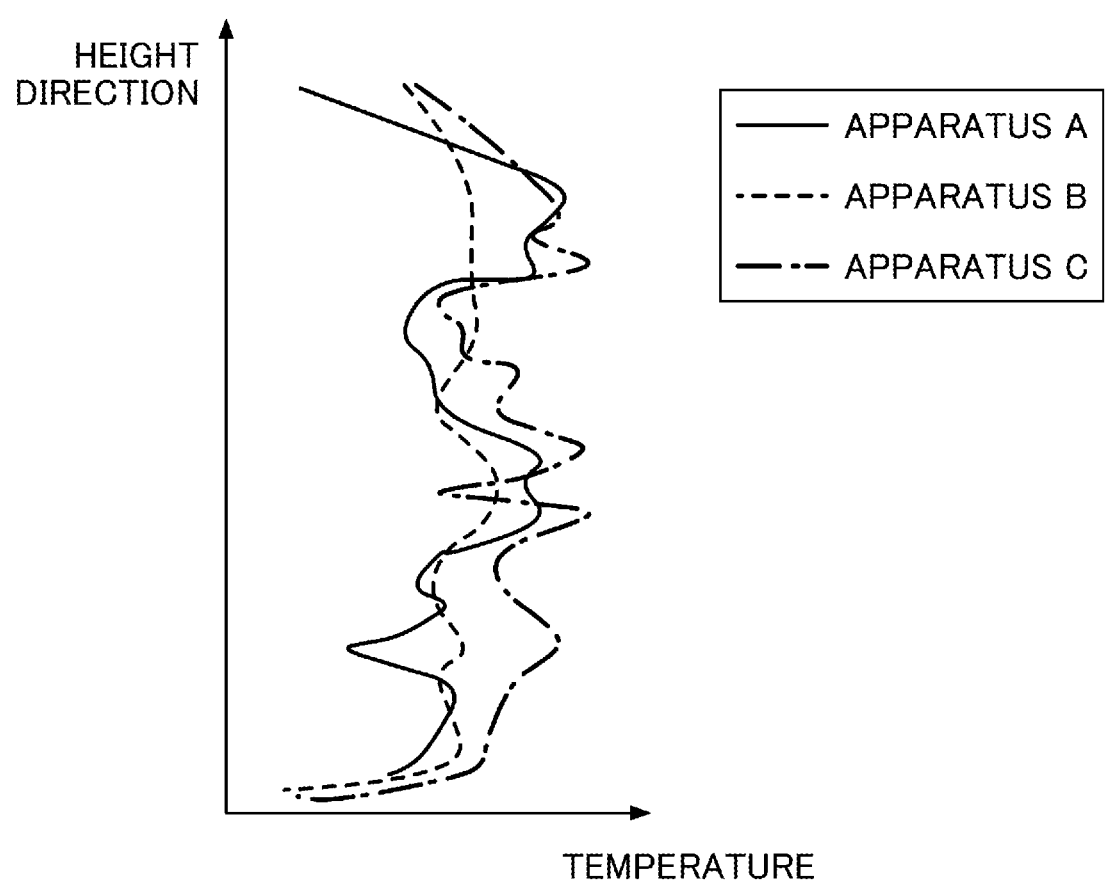
FIG. 5 is a graph indicating an example of a difference in temperature profiles due to an apparatus difference of the heat treatment apparatus.

Hereinafter, the temperature distribution along the height direction in the treatment chamber 65 may be referred to as a temperature profile. In the heat treatment apparatuses 10 illustrated in FIGS. 1 to 4, even when the power supplied to the heater 63 is identical, the temperature profiles differ, for example, as illustrated in FIG. 5, due to the presence of the apparatus difference, that is, an individual difference of the apparatus. FIG. 5 is a graph indicating an example of a difference in the temperature profiles due to the apparatus difference.

Thus, in order to stabilize the result of the heat treatment, the controller 100 of the heat treatment apparatus 10 is required to correct the apparatus difference of the heat treatment apparatus 10 and improve the uniformity of the temperature profile. For example, an operator performs the following operations to correct the apparatus difference of the heat treatment apparatus 10 to achieve the uniformity of the temperature profile.

Figure 6:
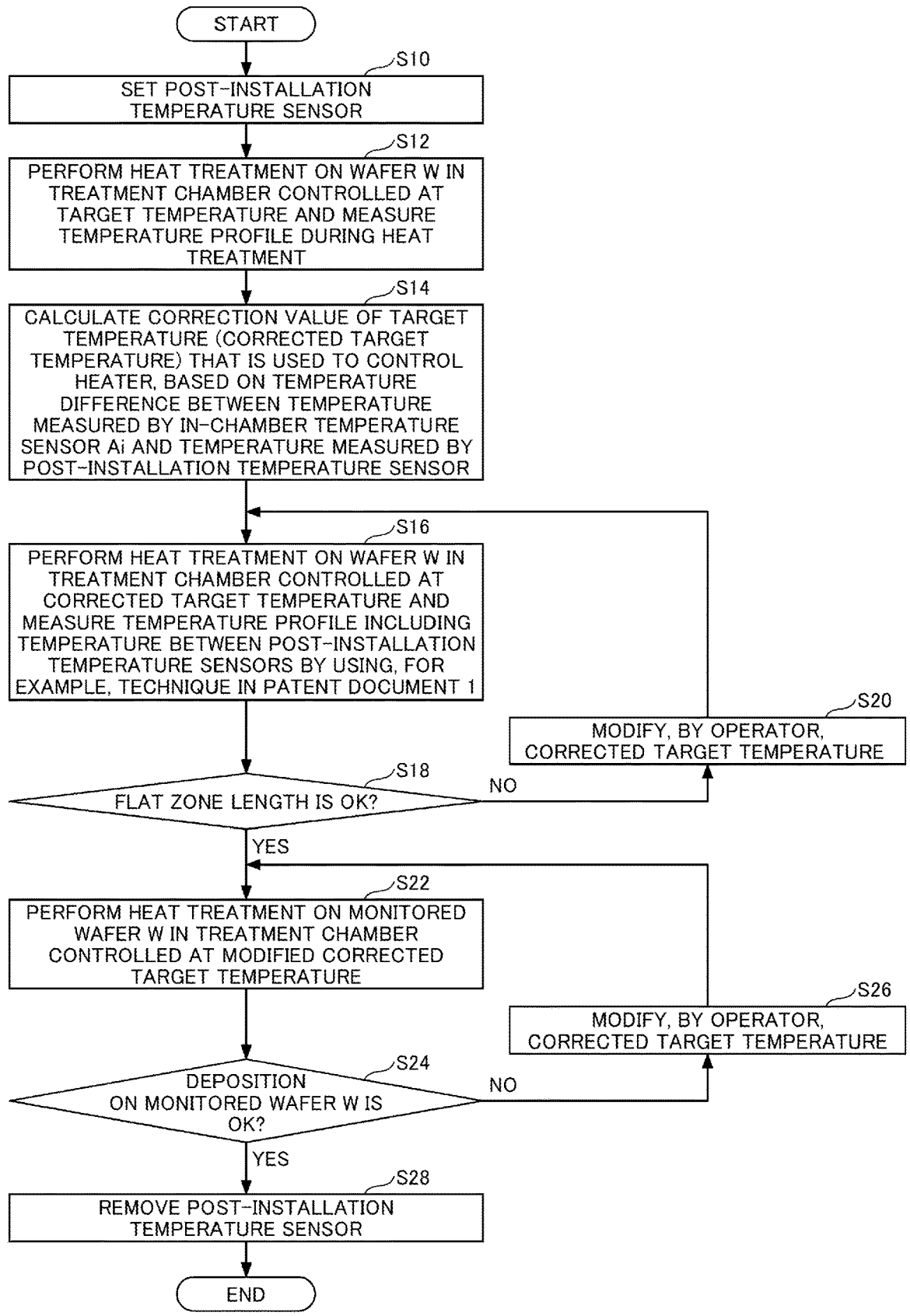
FIG. 6 is a flowchart of an example of a processing procedure of correcting the apparatus difference of the heat treatment apparatus to achieve the uniformity of the temperature profile.

FIG. 6 is a flowchart illustrating an example of a processing procedure to correct the apparatus difference of the heat treatment apparatus to achieve the uniformity of the temperature profile.

In step S10, the operator sets the post-installation temperature sensors in the treatment chamber 65 for a process of correcting the apparatus difference of the heat treatment apparatus 10. In step S12, the operator performs the heat treatment on the wafer W in the treatment chamber 65 that is controlled at the target temperature and measures the temperature profile during the heat treatment with at least the in-chamber temperature sensor Ai and the post-installation temperature sensor.

Figure 7:
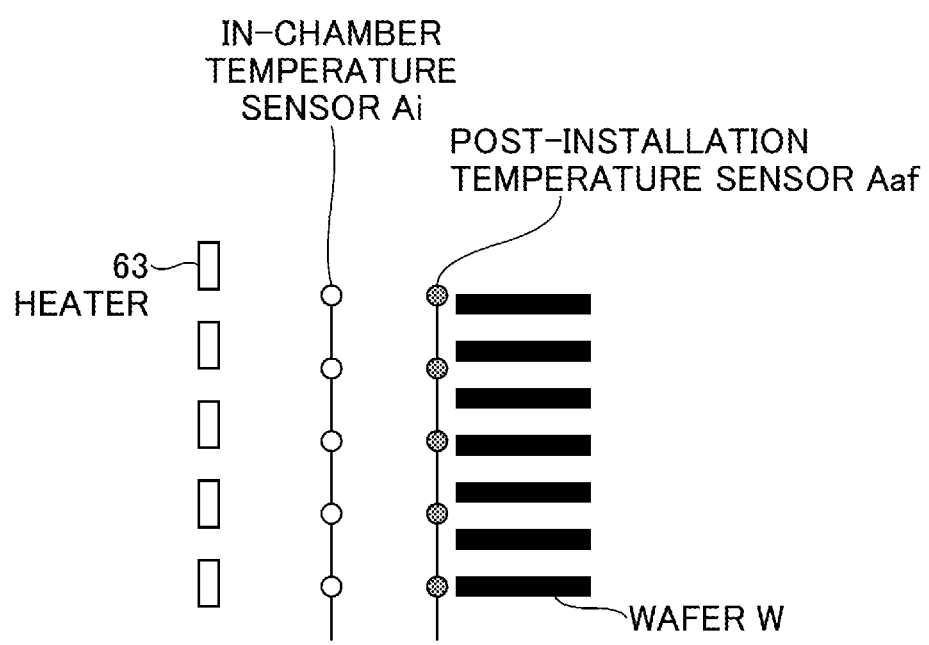
FIG. 7 is an explanatory drawing schematically illustrating a positional relationship of heaters, in-chamber temperature sensors, post-installation temperature sensors, and wafers.

FIG. 7 is an explanatory drawing schematically illustrating a positional relationship of the heaters, the in-chamber temperature sensors, the post-installation temperature sensors, and the wafers. In FIG. 7, the heaters 63 and the wafers W in the heat treatment apparatus 10 are illustrated, and the post-installation temperature sensors Aaf are provided closer to the wafers W than the in-chamber temperature sensors Ai. Additionally, in FIG. 7, the positions of the in-chamber temperature sensors Ai and the post-installation temperature sensors Aaf are aligned in the height direction (the wafer array direction). Based on the positional relationship of the post-installation temperature sensors Aaf and the in-chamber temperature sensors Ai illustrated in FIG. 7, the temperature measured by the post-installation temperature sensor Aaf is closer to the temperature of the wafer W than the temperature measured by the in-chamber temperature sensor Ai.

Figure 8A:
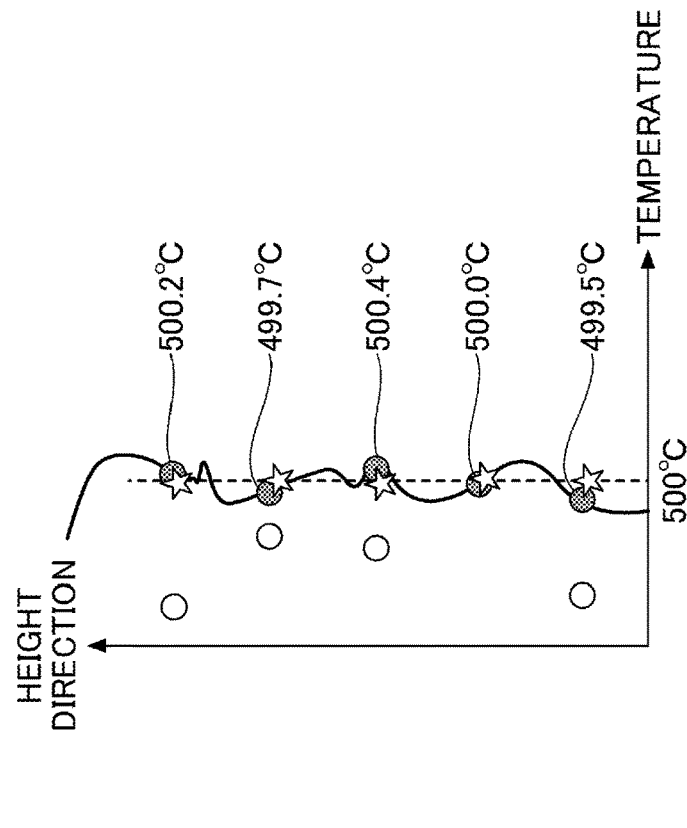
FIG. 8A and FIG. 8B are explanatory graphs indicating temperature shifts between temperatures measured by the post-installation temperature sensors Aaf and temperatures measured by the in-chamber temperature sensors Ai.
Figure 8B:
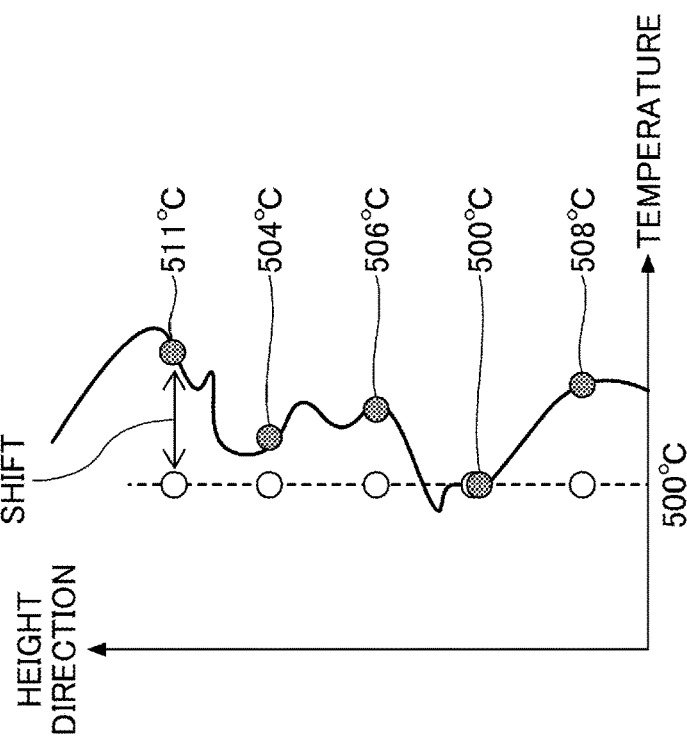

FIG. 8A and FIG. 8B are explanatory graphs indicating temperature shifts of the temperatures measured by the post-installation temperature sensors Aaf and the temperatures measured by the in-chamber temperature sensors Ai. For example, when the target temperature for the heat treatment of the wafer W is "500° C.", if the heat treatment is performed by controlling the temperatures measured by the in-chamber temperature sensors Ai to be "500° C.", the temperature shifts as illustrated in FIG. 8A occur between the target temperature "500° C." and the temperatures measured by the post-installation temperature sensors Aaf.

Because the temperatures measured by the post-installation temperature sensors Aaf are closer to the temperatures of the wafers W than the temperatures measured by the in-chamber temperature sensors Ai, the control should be performed so that the temperatures measured by the post-installation temperature sensors Aaf are "500° C.".

However, the post-installation temperature sensors Aaf are attached at a later time to correct the apparatus difference of the heat treatment apparatus 10 and are removed before the actual process of the heat treatment of the wafer, which is a product.

Thus, in step S14, the operator calculates a correction value for the target temperature "500° C." to be used to control the heater based on the temperature difference (the temperature shift) between the temperatures measured by the post-installation temperature sensor Aaf and the in-chamber temperature sensor Ai at the corresponding positions in the height direction as illustrated in FIG. 8A.

For example, the corrected target temperature to be used to control the heater is a temperature obtained by the amount of the temperature shift illustrated in FIG. 8A being offset from the target temperature "500° C.". By controlling the temperature measured by the in-chamber temperature sensor Ai to be the corrected target temperature, the temperature measured by the post-installation temperature sensor Aaf approaches the target temperature "500° C." as illustrated in FIG. 8B.

Returning to step S16 of FIG. 6, the operator sets the movable temperature sensors in the wafer array direction to utilize the technique of Patent Document 1. The operator performs the heat treatment on the wafer W in the treatment chamber 65 that is controlled at the corrected target temperature, and obtains the temperature profile, including the temperature between the post-installation temperature sensors Aaf, by continuously measuring the temperature distribution while moving the movable temperature sensor in the wafer array direction.

In step S18, the operator determines whether a result of the flat zone length measurement is OK, based on the temperature profile measured in step S16. If the result of the flat zone length measurement is not OK, in step S20, the operator repeatedly performs the processes of steps S16 to S20 while correcting the corrected target temperature.

If the result of the flat zone length measurement is OK, the process proceeds to step S22 and the operator installs the monitored wafer W. The operator performs the heat treatment on the monitored wafer W in the treatment chamber 65 that is controlled at the corrected target temperature. In step S24, the operator determines whether the result of the film deposition on the monitored wafer W is OK.

If the result of the film deposition on the monitored wafer W is not OK, in step S26, the operator repeatedly performs the processes of steps S22 to S26 while correcting the corrected target temperature. If the result of the film deposition on the monitored wafer W is OK, the process proceeds to step S28 and the operator removes the post-installation temperature sensors set in step S10.

The processes of steps S16 to S26 are for increasing the number of the positions where the temperatures are measured and the number of the evaluation items to improve the accuracy of the corrected target temperature because there are only a few positions where the temperatures can be measured by the post-installation temperature sensors Aaf.

However, in the process of the flowchart illustrated in FIG. 6, man-hours are required to measure the temperature during the heat treatment of the wafer W and to deposit the film on the monitored wafer W in the treatment chamber 65. Additionally, in the process of the flowchart illustrated in FIG. 6, the processes of step S20 and step S26 are performed based on the judgment and experience of the operator, and the target temperature may not be appropriately corrected.

Therefore, the heat treatment apparatus 10 according to the present embodiment predicts the temperature at a position spaced away from the post-installation temperature sensor Aaf (e.g., between multiple post-installation temperature sensors Aaf) by utilizing the digital twin technology described below, and corrects the target temperature to be used to control the heater so as to absorb the apparatus difference of the heat treatment apparatus 10, so that the uniformity of the temperature profile is obtained.

The controller 100 of the heat treatment apparatus 10 utilizes the digital twin technology to modify a standard simulation model that is an average simulation model of the heat treatment apparatus 10, to obtain an individual simulation model reflecting the apparatus difference of the heat treatment apparatus 10.

Figure 9C:
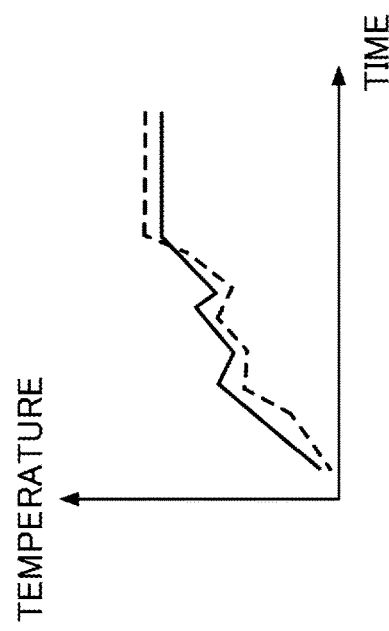
FIG. 9A, FIG. 9B, and FIG. 9C are drawings illustrating an example of a use of a digital twin technology for a heat treatment apparatus according to the present embodiment.
Figure 9B:
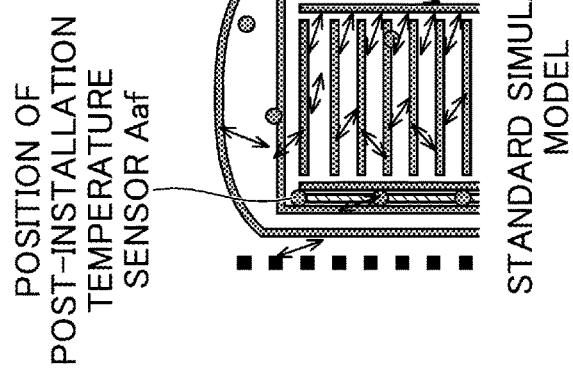
Figure 9A:
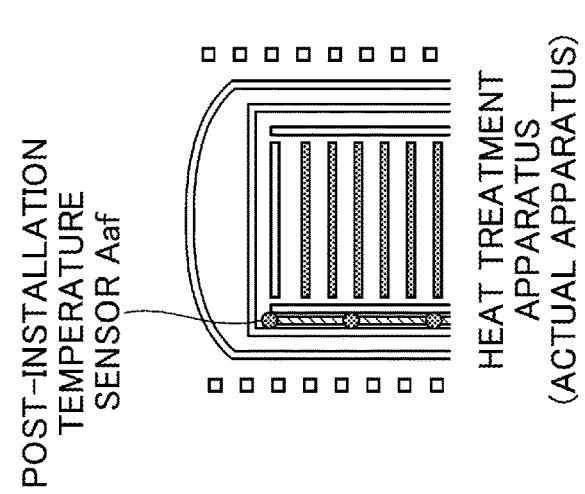

FIG. 9A, FIG. 9B, and FIG. 9C are drawings illustrating an example of a use of the digital twin technology of the heat treatment apparatus according to the present embodiment. FIG. 9A illustrates the post-installation temperature sensors Aaf set in the actual heat treatment apparatus 10. FIG. 9B illustrates the standard simulation model of the heat treatment apparatus 10 illustrated in FIG. 9A.

The standard simulation model of the heat treatment apparatus 10, by performing the simulation in accordance with process parameters identical to the process parameters of the heat treatment apparatus 10 of FIG. 9A in which the heat treatment is being performed, can predict the temperature at any position as well as the positions of the post-installation temperature sensors Aaf of the heat treatment apparatus 10 during the heat treatment.

Here, in the standard simulation model of the heat treatment apparatus 10 illustrated in FIG. 9B, the relationship of heat exchange, the specific heat, and the like are modeled. However, due to the presence of the apparatus difference of the heat treatment apparatus 10 and an element that cannot be modeled, a temperature difference as illustrated in FIG. 9C occurs between the temperatures measured by the post-installation temperature sensors Aaf set in the actual heat treatment apparatus 10 and the temperatures at the positions of the post-installation temperature sensors Aaf that are predicted by the standard simulation model of the heat treatment apparatus 10.

Figure 10A:
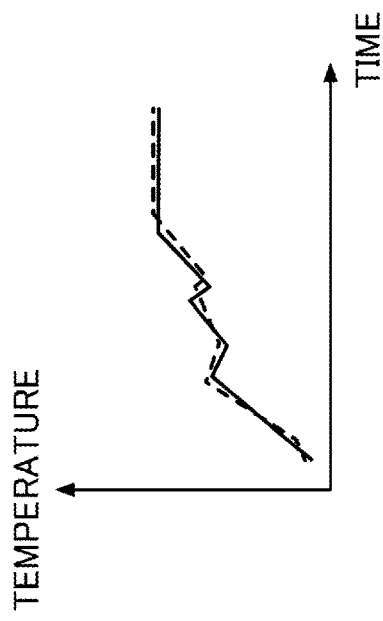
FIG. 10A, FIG. 10B, and FIG. 10C are drawings illustrating an example of the use of the digital twin technology for the heat treatment apparatus according to the present embodiment.
Figure 10B:
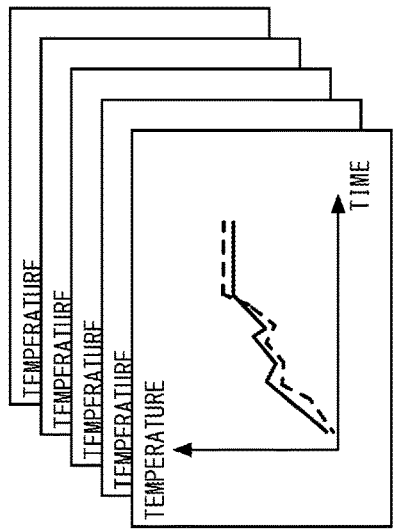
Figure 10C:
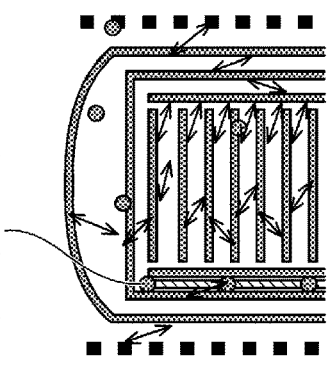

Therefore, in the present embodiment, as illustrated in FIG. 10, the standard simulation model of the heat treatment apparatus 10 is modified to obtain the individual simulation model reflecting the apparatus difference of the heat treatment apparatus 10. FIG. 10A, FIG. 10B, and FIG. 10C are drawings illustrating an example of the use of the digital twin technology of the heat treatment apparatus according to the present embodiment.

FIG. 10A illustrates the standard simulation model of the heat treatment apparatus 10. The temperatures measured by the post-installation temperature sensors Aaf set in the heat treatment apparatus 10 can be acquired from the actual heat treatment apparatus 10 in which the heat treatment is being performed. Additionally, by performing the simulation in accordance with the process parameters identical to the process parameters of the actual heat treatment 10 in which the heat treatment is being performed, the standard simulation model of the heat treatment apparatus 10 can predict the temperature at the positions of the post-installation temperature sensors Aaf.

FIG. 10B illustrates information about temperature differences between the temperatures measured by the post-installation temperature sensors Aaf set in the actual heat treatment apparatus 10 and the temperatures at the positions of the post-installation temperature sensors Aaf that are predicted by the standard simulation model of the heat treatment apparatus 10. The information about the temperature differences in FIG. 10B can be acquired for as many as the number of the post-installation temperature sensors Aaf.

The relationship of heat exchange, the specific heat, and the like in the standard simulation model of the heat treatment apparatus 10 are modified so as to reduce the temperature difference of FIG. 10B, so that the standard model can be modified to obtain the individual simulation model of the heat treatment apparatus 10 that can predict a temperature having a small temperature difference from the temperature in the actual apparatus as illustrated in FIG. 10C, for example.

Figure 11B:
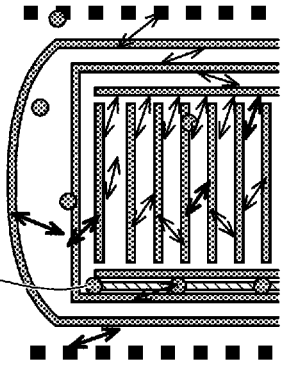
FIG. 11A and FIG. 11B are drawings illustrating an example of the use of the digital twin technology for the heat treatment apparatus according to the present embodiment.
Figure 11A:
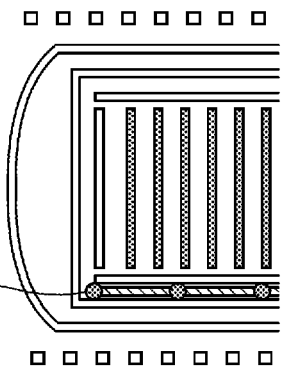

FIG. 11A and FIG. 11B are drawings illustrating an example of the use of the digital twin technology of the heat treatment apparatus according to the present embodiment. FIG. 11A illustrates the post-installation temperature sensors Aaf set in the actual heat treatment apparatus 10. FIG. 11B illustrates the individual simulation model of the heat treatment apparatus 10 that is obtained by modifying the standard simulation model of the heat treatment apparatus 10.

In the present embodiment, by utilizing the individual simulation model of the heat treatment apparatus 10 illustrated in FIG. 11B, the temperature at the position where the post-installation temperature sensor Aaf is not set can be accurately predicted.

As described above, in the present embodiment, by utilizing the individual simulation model of the heat treatment apparatus 10, what is called the digital twin, in which a change in the actual (physical) space, which is the temperature profile of the heat treatment apparatus 10 during the heat treatment is being performed, is cooperatively reproduced in a virtual (cyber) space, can be achieved. In the digital twin, the state of the temperature profile of the heat treatment apparatus 10 can be reproduced in the virtual space while performing the heat treatment in the heat treatment apparatus 10.

Thus, the heat treatment apparatus 10 according to the present embodiment performs the simulation with the individual simulation model reflecting the apparatus difference of the heat treatment apparatus 10, predicts a temperature other than the positions of the post-installation temperature sensors Aaf, and corrects the target temperature to be used to control the heater. By doing this, the heat treatment apparatus 10 according to the present embodiment can improve the uniformity of the temperature profile.

Figure 12B:
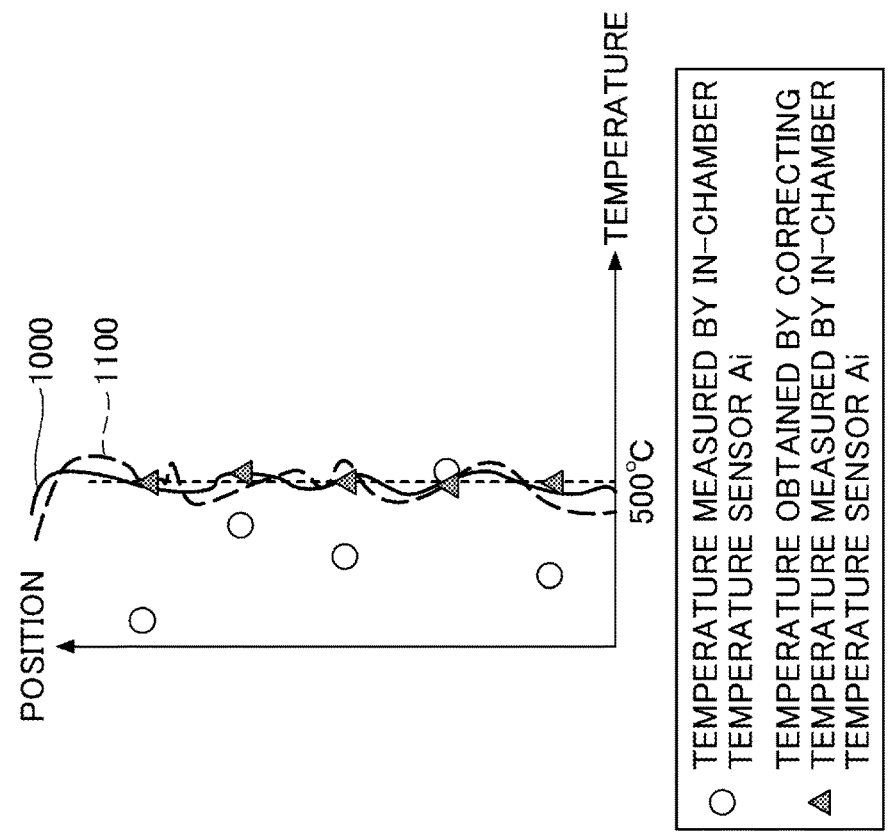
FIG. 12A and FIG. 12B are explanatory graphs indicating temperature shifts between the temperatures measured by the post-installation temperature sensors Aaf, predicted temperatures, at positions where no post-installation temperature sensor Aaf is installed, predicted by an individual simulation model, and the temperatures measured by the in-chamber temperature sensors Ai.
Figure 12A:
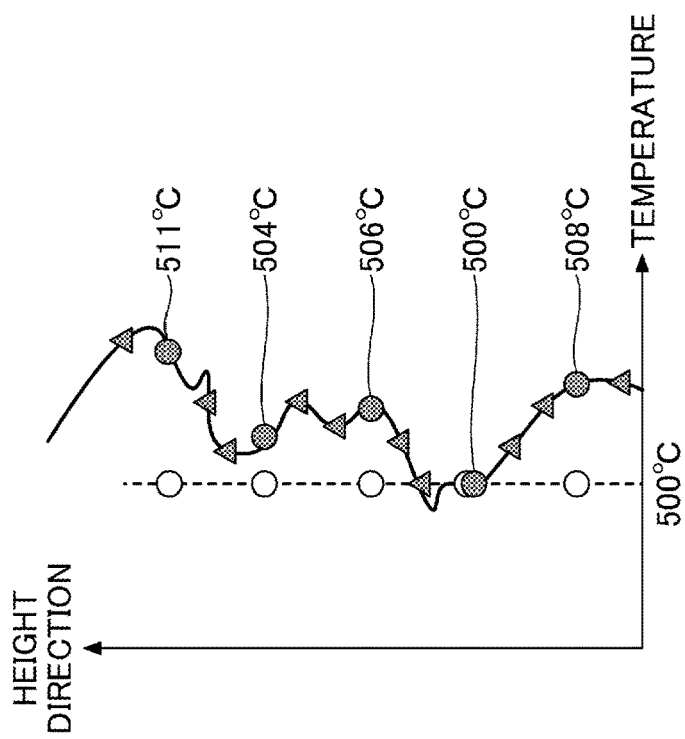

FIG. 12A and FIG. 12B are explanatory graphs indicating temperature shifts between the temperatures measured by the post-installation temperature sensors Aaf, the temperatures at positions where no post-installation temperature sensor Aaf is disposed that are predicted by the individual simulation model, and the temperatures measured by the in-chamber temperature sensors Ai.

For example, in the case of the target temperature for the heat treatment of the wafer W being "500° C.", when the heat treatment is performed by controlling the temperatures measured by the in-chamber temperature sensors Ai to be "500° C.", the temperature shifts as illustrated in FIG. 12A occur between the temperatures measured by the post-installation temperature sensors Aaf and the target temperature "500° C.".

However, FIG. 12A differs from FIG. 8A in that the predicted temperature, at the position where no post-installation temperature sensor Aaf is disposed, is calculated. In the present embodiment, the temperature difference (the temperature shift) between the temperatures measured by the post-installation temperature sensor Aaf and the in-chamber temperature sensor Ai that are located at the corresponding positions in the height direction as illustrated in FIG. 12B and the temperature difference between the temperature at the position where no post-installation temperature sensor Aaf is disposed that is predicted by the individual simulation model and the temperature measured by the in-chamber temperature sensor Ai are averaged, and the correction value for the target temperature "500° C." to be used to control the heater is calculated.

In the examples of FIG. 12A and FIG. 12B, because the temperature at the position where no post-installation temperature sensor Aaf is disposed that is predicted by the individual simulation model is also utilized, a large temperature shift from the target temperature does not occur at the position where no post-installation temperature sensor Aaf is disposed, and a temperature profile 1000 that is more accurate than a conventional temperature profile 1100 can be obtained.

Figure 13:
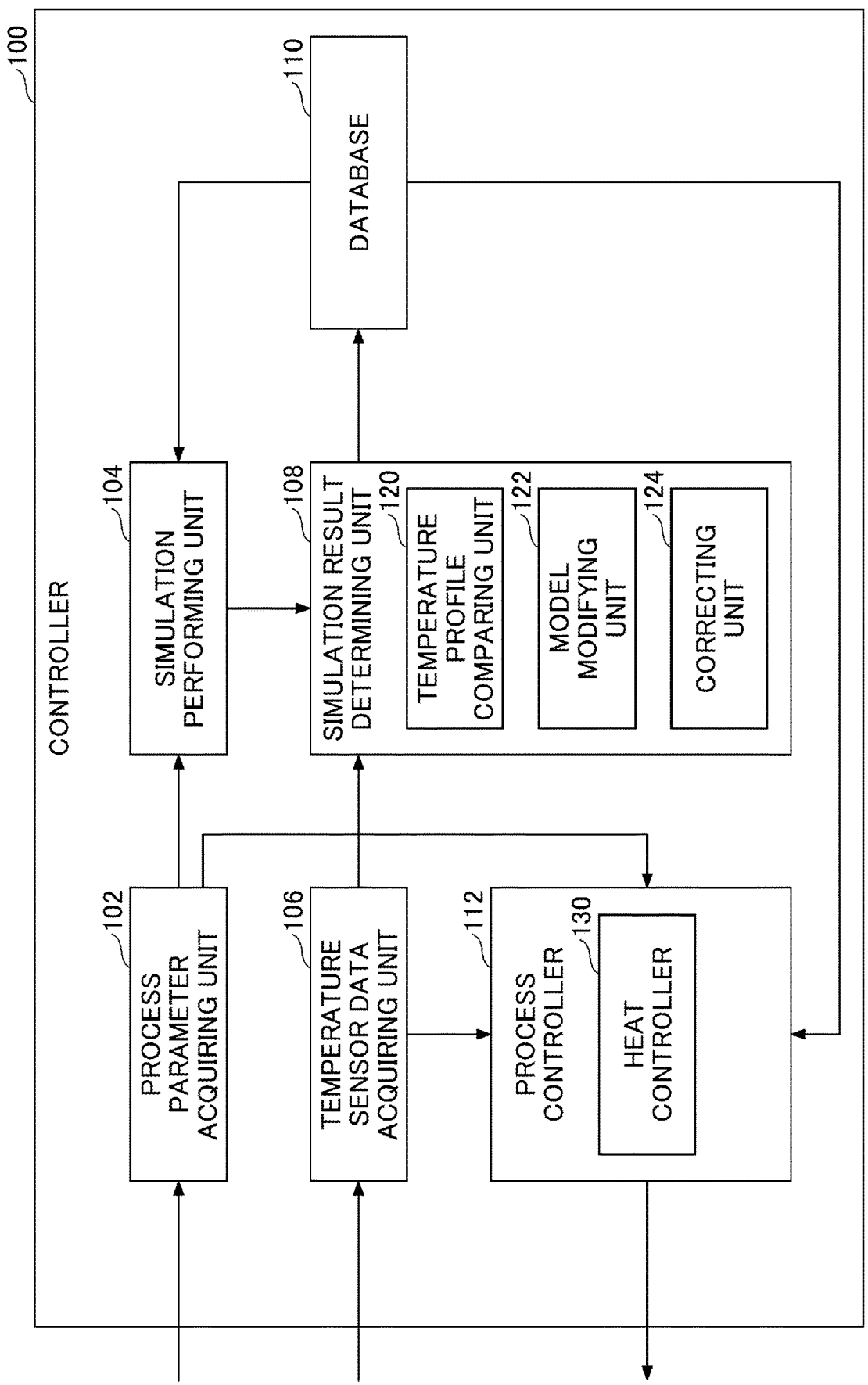
FIG. 13 is a functional block diagram illustrating an example of a controller of the heat treatment apparatus according to the present embodiment.

The controller 100 of the heat treatment apparatus 10 according to the present embodiment is achieved, for example, by a functional block illustrated in FIG. 13. FIG. 13 is a functional block diagram illustrating an example of the controller of the heat treatment apparatus according to the present embodiment. In the functional block diagram illustrated in FIG. 13, a configuration that is not necessary for the description of the present embodiment is not illustrated.

The controller 100 of FIG. 13 executes a program to implement a process parameter acquiring unit 102, a simulation performing unit 104, a temperature sensor data acquiring unit 106, a simulation result determining unit 108, a database 110, and a process controller 112.

Additionally, the simulation result determining unit 108 includes a temperature profile comparing unit 120, a model modifying unit 122, and a correcting unit 124. The process controller 112 includes a heating controller 130.

The process parameter acquiring unit 102 acquires the process parameters of the process executed by the heat treatment apparatus 10. The process parameter acquiring unit 102 supplies the acquired process parameters to the simulation performing unit 104 and the process controller 112.

The simulation performing unit 104 reads the standard or individual simulation model of the heat treatment apparatus 10 from the database 110 and performs the simulation in accordance with the process parameters provided by the process parameter acquiring unit 102 to calculate a process state of the heat treatment apparatus 10 during performing the process. The process state of the heat treatment apparatus 10 calculated by the simulation performing unit 104 includes not only the predicted temperature at the position of the post-installation temperature sensor Aaf of the heat treatment apparatus 10 during the heat treatment, which is described above, but also the predicted temperature at the position where no post-installation temperature sensor Aaf is disposed. The simulation performing unit 104 supplies the predicted temperature predicted by the standard or individual simulation model to the simulation result determining unit 108.

The temperature sensor data acquiring unit 106 acquires the measurement signals (the signals indicating measurement temperatures) measured by the heater temperature sensor Ao, the in-chamber temperature sensor Ai, the movable temperature sensor Ap, and the post-installation temperature sensor, as temperature sensor data. Additionally, the temperature sensor data acquiring unit 106 supplies the acquired temperature sensor data to the simulation result determining unit 108 and the process controller 112.

The simulation result determining unit 108 determines the simulation result by using the temperature measured by the in-chamber temperature sensor Ai and the temperature measured by the post-installation temperature sensor Aaf that are acquired by the temperature sensor data acquiring unit 106 and the temperature predicted by the standard or individual simulation model.

The temperature profile comparing unit 120 of the simulation result determining unit 108 compares the temperature measured by the post-installation temperature sensor Aaf that is acquired from the actual heat treatment apparatus 10 during performing the heat treatment with the temperature at the position of the post-installation temperature sensor Aaf that is predicted by the standard simulation model in accordance with the process parameters identical to the process parameters of the actual heat treatment apparatus 10.

The model modifying unit 122 obtains information about the temperature difference between the measured temperature and the predicted temperature at the position of the post-installation temperature sensor Aaf, based on the comparison result generated by the temperature profile comparing unit 120. The model modifying unit 122 modifies the relationship of the heat exchange and the specific heat in the standard simulation model so that the temperature difference between the measured temperature and the predicted temperature at the position of the post-installation temperature sensor Aaf decreases, thereby modifying the simulation model to obtain the individual simulation model having a small temperature difference from the actual apparatus.

Additionally, the correcting unit 124 corrects the target temperature to be used to control the heater by using the temperatures measured by the in-chamber temperature sensor Ai and the post-installation temperature sensor Aaf of the actual heat treatment apparatus 10 in which the heat treatment is being performed, and the temperature at the position where no post-installation temperature sensor Aaf is disposed that is predicted by the individual simulation model in accordance with the process parameters identical to the process parameters of the actual heat treatment apparatus 10.

For example, the correcting unit 124 averages the temperature difference (the temperature shift) between the temperatures measured by the post-installation temperature sensor Aaf and the in-chamber temperature sensor Ai at the corresponding positions in the height direction, and the temperature difference between the temperature at the position where no post-installation temperature sensor Aaf is disposed that is predicted by the individual simulation model and the temperature measured by the in-chamber temperature sensor Ai, and calculates the correction value for the target temperature to be used to control the heater.

The database 110 stores data used by the simulation performing unit 104 to perform the simulation, such as the standard simulation model of the heat treatment apparatus 10, the individual simulation model obtained by modifying the standard simulation model to reflect the apparatus difference of the heat treatment apparatus 10, and the corrected target temperature to be used to control the heater.

The process controller 112 performs the process in the heat treatment apparatus 10 in accordance with the process parameters supplied by the process parameter acquiring unit 102. The heating controller 130 controls the heater at the target temperature corrected by the correcting unit 124 to improve the uniformity of the temperature profile.

Figure 14:
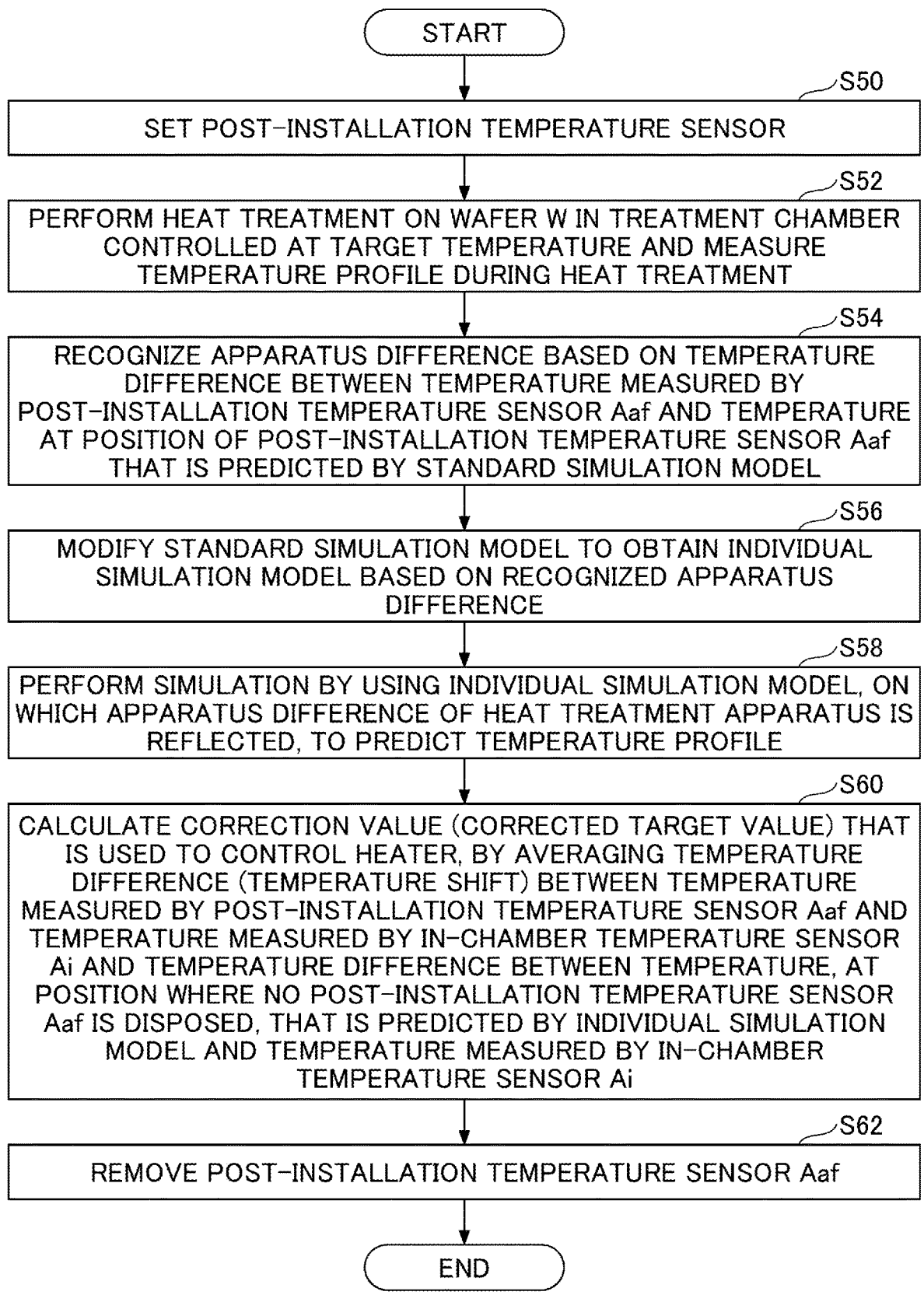
FIG. 14 is a flowchart of an example of a processing procedure of correcting the apparatus difference of the heat treatment apparatus according to the present embodiment to achieve the uniformity of the temperature profile.

FIG. 14 is a flowchart illustrating an example of a processing procedure to obtain the uniformity of the temperature profile by correcting the apparatus difference of the heat treatment apparatus according to the present embodiment.

In step S50, the operator sets the post-installation temperature sensor in the treatment chamber 65 for a correcting process to absorb the apparatus difference of the heat treatment apparatus 10. In step S52, the operator performs the heat treatment on the wafer W in the treatment chamber 65 controlled at the target temperature. The in-chamber temperature sensor Ai and the post-installation temperature sensor Aaf of the heat treatment apparatus 10 measure the temperature profile during the heat treatment. The temperature sensor data acquiring unit 106 of the controller 100 acquires the temperatures measured by the in-chamber temperature sensor Ai and the post-installation temperature sensor Aaf.

In step S54, the simulation performing unit 104 performs the simulation with the standard simulation model in accordance with the process parameters identical to the process parameters of the actual heat treatment apparatus 10.

The temperature profile comparing unit 120 compares the temperature measured by the post-installation temperature sensor Aaf that is obtained from the actual heat treatment apparatus 10 with the temperature at the position of the post-installation temperature sensor Aaf that is predicted by the standard simulation model in accordance with the identical process parameters. The model modifying unit 122 obtains the information about the temperature difference from the comparison result and recognizes the apparatus difference based on the information about the temperature difference.

In step S56, the model modifying unit 122 modifies the standard simulation model so that the temperature difference between the measured temperature and the predicted temperature at the position of the post-installation temperature sensor Aaf decreases, to obtain the individual simulation model having a small temperature difference from the actual apparatus.

In step S58, the simulation performing unit 104 performs the simulation with the individual simulation model in accordance with the process parameters identical to the process parameters of the actual heat treatment apparatus 10.

The in-chamber temperature sensor Ai and the post-installation temperature sensor Aaf of the heat treatment apparatus 10 measure the temperature profile during the heat treatment. The temperature sensor data acquiring unit 106 of the controller 100 acquires the temperatures measured by the in-chamber temperature sensor Ai and the post-installation temperature sensor Aaf.

In step S60, the correcting unit 124 corrects the target temperature to be used to control the heater by using the temperatures measured by the in-chamber temperature sensor Ai and the post-installation temperature sensor Aaf of the actual heat treatment apparatus 10 and the temperature at the position where no temperature sensor Aaf is disposed that is predicted by the individual simulation model in accordance with the process parameters identical to the actual heat treatment apparatus 10. In step S62, the operator removes the post-installation temperature sensor set in step S50.

In the process of the flowchart illustrated in FIG. 14, without increasing the position where the temperature can be measured by the post-installation temperature sensor Aaf, the temperatures of many positions where no post-installation temperature sensor Aaf is disposed can be predicted by using the individual simulation model obtained by taking into account the apparatus difference. As described, in the present embodiment, the temperatures at many positions that are predicted with the individual simulation model can be used to correct the target temperature, thereby improving the uniformity of the temperature profile.

Additionally, in the present embodiment, the processes in steps S16 to S26 of the flowchart illustrated in FIG. 6 are not required, and materials required for starting up the heat treatment apparatus 10 and the man-hours of the work using these materials can be reduced.

Further, because the necessary materials and man-hours are small, the use of the present embodiment is promoted at a time other than the startup of the heat treatment apparatus 10. For example, when it is suspected that a performance change due to aging of the heat treatment apparatus 10 occurs, the correction value of the target temperature can easily be recalculated by performing the process according to the present embodiment.

Further, in the process of the flowchart of FIG. 14, the accuracy may be further improved by calculating the corrected target temperature in step S60, returning to the process in step S52 after the calculating, performing the heat treatment on the wafer W in the treatment chamber 65 controlled at the corrected target temperature, and repeating steps S52 to S60.

Here, in the present embodiment, an example of grasping the apparatus difference of the heat treatment apparatus 10 by using the post-installation temperature sensor Aaf has been described. However, other methods of grasping the apparatus difference may be used. If other methods of grasping the apparatus difference can be used, the operator can reduce man-hours required to set the post-installation temperature sensor Aaf in the treatment chamber 65 for a correcting process to absorb the apparatus difference of the heat treatment apparatus 10.

Second Embodiment

In the above-described first embodiment, the controller 100 of the heat treatment apparatus 10 performs the process of correcting the apparatus difference of the heat treatment apparatus 10 and improving the uniformity of the temperature profile to stabilize the result of the heat treatment. In the second embodiment, another information processing device connected to the controller 100 of the heat treatment apparatus 10 for data communication performs the process of correcting the apparatus difference of the heat treatment apparatus 10 and improving the uniformity of the temperature profile.

Figure 15:
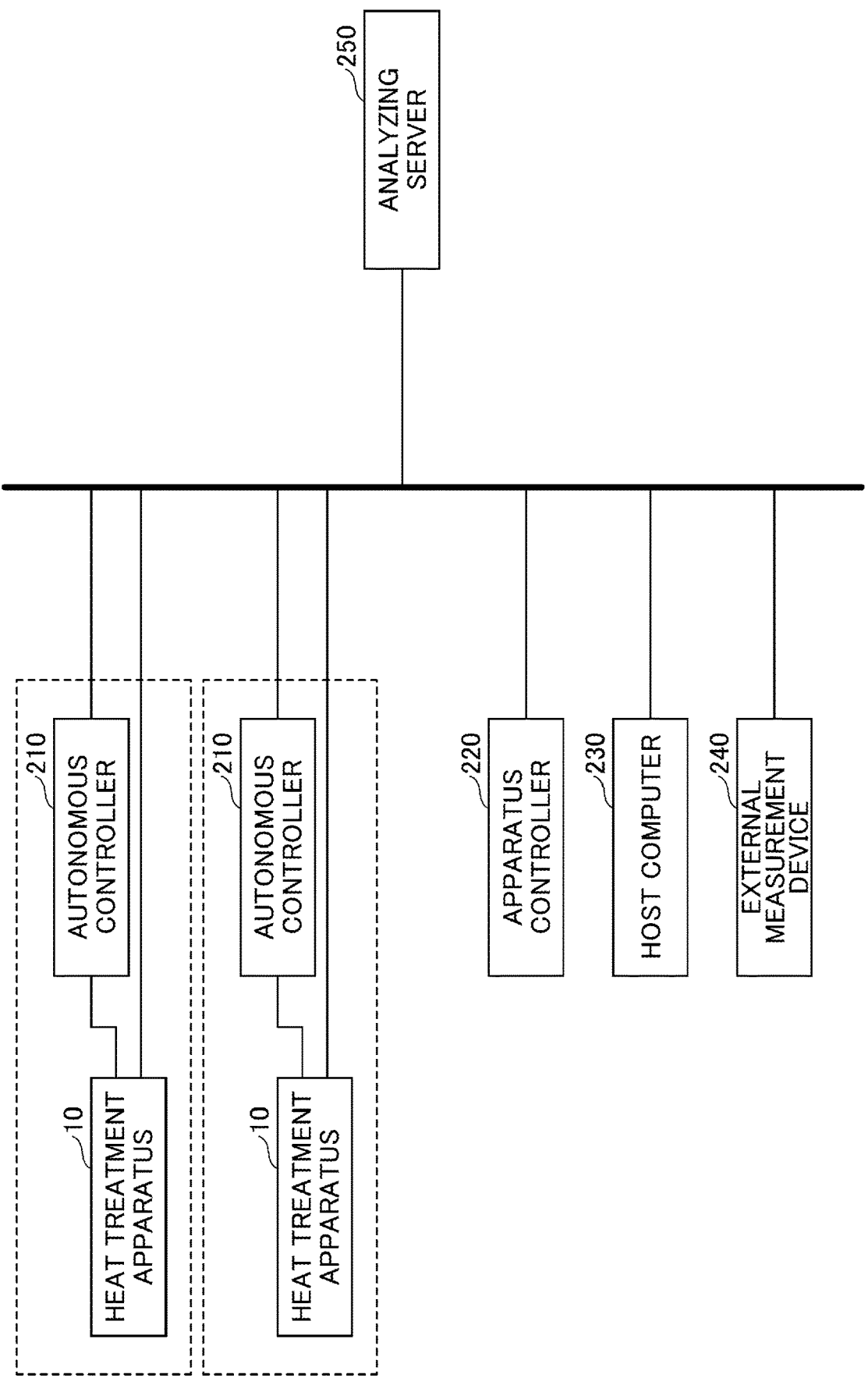
FIG. 15 is a configuration diagram of an example of an information processing system according to the present embodiment.

FIG. 15 is a configuration diagram illustrating an example of an information processing system according to the present embodiment. The information processing system of FIG. 15 includes the heat treatment apparatus 10, an autonomous controller 210, an apparatus controller 220, a host computer 230, an external measurement device 240, and an analyzing server 250.

The heat treatment apparatus 10, the autonomous controller 210, the apparatus controller 220, the host computer 230, the external measurement device 240, and the analyzing server 250 are communicatively connected via a network such as a local area network (LAN).

The heat treatment apparatus 10 performs a process in accordance with control instructions (process parameters) output from the apparatus controller 220. The autonomous controller 210 is a controller that autonomously controls the heat treatment apparatus 10 and performs a simulation of the state of the process being performed in the heat treatment apparatus 10, by using the standard or individual simulation model. The autonomous controller 210 is provided for each heat treatment apparatus 10. The autonomous controller 210 performs the process of correcting the apparatus difference of the heat treatment apparatus 10 and improving the uniformity of the temperature profile that is performed by the controller 100 according to the first embodiment. This can reduce the processing load of the controller 100 of the heat treatment apparatus 10.

Additionally, the apparatus controller 220 is a controller having a computer configuration for controlling the heat treatment apparatus 10. The apparatus controller 220 outputs the process parameters for controlling the control components of the heat treatment apparatus 10 to the heat treatment apparatus 10. The host computer 230 is an example of a man-machine interface (MMI) that receives instructions for the heat treatment apparatus 10 from the operator and supplies information about the heat treatment apparatus 10 to the operator.

The external measurement device 240 is a measurement device that measures a result obtained after the process in accordance with the process parameters has been performed, such as a film thickness measurement device, a sheet resistance measurement device, a particle measurement device, and the like. The external measurement device 240, for example, measures the degree of film deposition on the wafer, such as the monitored wafer.

The analyzing server 250 performs, for example, data analysis necessary for the process performed by the autonomous controller 210. For example, the analyzing server 250 may edit the standard simulation model of the heat treatment apparatus 10 based on data collected from the multiple heat treatment apparatuses 10. For example, a base of the standard simulation model of the heat treatment apparatus 10 may be a model that models as many common portions of the multiple heat treatment apparatuses 10 as possible.

The information processing system illustrated in FIG. 15 is an example, and it is apparent that there are various system configuration examples depending on the application and purpose. A device division such as the heat treatment apparatus 10, the autonomous controller 210, the apparatus controller 220, the host computer 230, the external measurement device 240, and the analyzing server 250 in FIG. 15 is an example.

For example, the information processing system may have various configurations, such as an integrated configuration of at least two of the heat treatment apparatus 10, the autonomous controller 210, the apparatus controller 220, the host computer 230, the external measurement device 240, and the analyzing server 250, or a further divided configuration.

Figure 16:
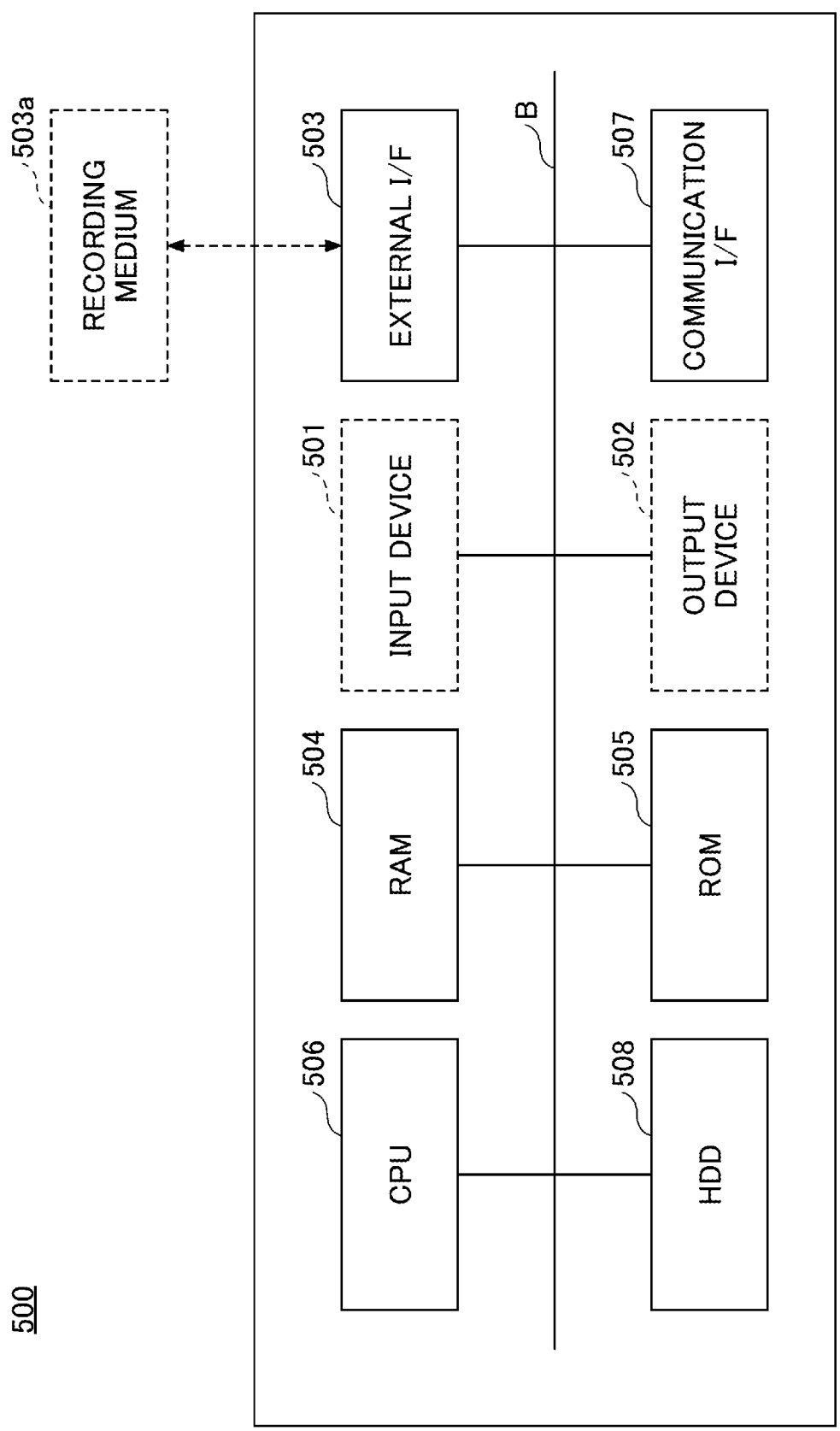
FIG. 16 is a hardware configuration diagram of an example of a computer.

The autonomous controller 210, the apparatus controller 220, the host computer 230, and the analyzing server 250 of the information processing system illustrated in FIG. 15 are implemented by computers each having a hardware configuration illustrated in FIG. 16, for example. The above-described controller 100 of the heat treatment apparatus 10 is also implemented by a computer having the hardware configuration as illustrated in FIG. 16. FIG. 16 is an example of a hardware configuration diagram of a computer.

The computer 500 of FIG. 16 includes an input device 501, an output device 502, an external interface (I/F) 503, a random access memory (RAM) 504, a read only memory (ROM) 505, a central processing unit (CPU) 506, a communication I/F 507, and a hard disk drive (HDD) 508, each of which is interconnected by a bus B. Here, the input device 501 and the output device 502 may be connected and utilized when necessary.

The input device 501 is a keyboard, a mouse, a touch panel, or the like, and is used by the operator or the like to input operation signals. The output device 502 is a display or the like and displays a processing result of the computer 500. The communication I/F 507 is an interface that connects the computer 500 to the network. The HDD 508 is an example of a non-volatile storage device that stores programs and data.

The external I/F 503 is an interface with an external device. The computer 500 may read data from a recording medium 503a and/or write data to a recording medium 503a, such as a secure digital (SD) memory card, via the external I/F 503. The ROM 505 is an example of a non-volatile semiconductor memory (storage device) in which programs and data are stored. The RAM 504 is an example of a volatile semiconductor memory (storage device) that temporarily stores programs and data.

The CPU 506 is an arithmetic device that reads programs and data from storage devices, such as the ROM 505 and the HDD 508, to the RAM 504, and executes the processing to achieve control and functions of the entire computer 500.

The autonomous controller 210, the apparatus controller 220, the host computer 230, and the analyzing server 250 of the information processing system illustrated in FIG. 16 can achieve various functions by using the hardware configuration of the computer 500 of FIG. 16 or the like. Additionally, the controller 100 of the heat treatment apparatus 10 described above can achieve various functions by using the hardware configuration of the computer 500 of FIG. 16 or the like.

According to the present embodiment, the uniformity of the temperature distribution in the treatment chamber 65 during performing the heat treatment of the wafer can be improved by using the individual simulation model obtained by taking into account the apparatus difference of the heat treatment apparatus 10.

While the preferred embodiments of the invention have been described in detail above, the invention is not limited to the embodiments described above, and various modifications and substitutions can be made to the embodiments described above without departing from the scope of the invention.

What is claimed is:

1. An information processing system including a heater configured to heat substrates to be treated, a heat treatment apparatus configured to perform heat treatment on the substrates to be treated in a treatment chamber, and an information processing device configured to output a target temperature to be used to control the heater, the information processing system comprising:

an in-chamber temperature measuring unit and a post-installation temperature measuring unit, each of which is configured to measure a temperature distribution, in an array direction of the substrates to be treated, at positions between the heater and the substrates to be treated in the treatment chamber;

a memory; and a processor coupled to the memory and configured to:

measure the temperature distribution at the positions between the heater and the substrates to be treated in the treatment chamber by using the post-installation temperature measuring unit;

perform a simulation of the temperature distribution during performing the heat treatment on the substrates to be treated in the treatment chamber, to obtain a standard simulation temperature distribution by using a standard simulation model of the heat treatment apparatus;

modify the standard simulation model to obtain an individual simulation model in which an individual difference of the heat treatment apparatus is reflected, based on a difference between the measured temperature distribution and the obtained standard simulation temperature distribution;

perform the simulation of the temperature distribution during performing the heat treatment on the substrates to be treated in the treatment chamber, to obtain an individual simulation temperature distribution by using the obtained individual simulation model; and control power supplied to the heater to increase or decrease an amount of heat generation of the heater so as to heat a wafer during a semiconductor manufacturing process, based on the obtained individual simulation temperature distribution, wherein each of the standard simulation model and the individual simulation model models how heat is exchanged in the heat treatment apparatus, the standard simulation temperature distribution is predicted using the standard simulation model, and the individual simulation temperature distribution is predicted using the individual simulation model.

2. The information processing system as claimed in claim 1, wherein the in-chamber temperature measuring unit is configured to measure the temperature distribution in the array direction of the substrates to be treated, with a plurality of temperature measuring elements previously provided in the heat treatment apparatus, and the post-installation temperature measuring unit is configured to measure the temperature distribution in the array direction of the substrates to be treated, with a plurality of temperature measuring elements later provided in the heat treatment apparatus, and wherein the post-installation temperature measuring unit is provided at a position closer to the substrates to be treated than the in-chamber temperature measuring unit, and the post-installation temperature measuring unit measures the temperature distribution that is required when the standard simulation model is modified to obtain the individual simulation model and that is required when the target temperature used to control the heater is corrected.

3. The information processing system as claimed in claim 2, wherein the processor modifies the standard simulation model to obtain the individual simulation model based on a difference between second measured temperatures and standard predicted temperatures at positions of the plurality of temperature measuring elements of the post-installation temperature measuring unit, the second measured temperatures being respectively measured by the plurality of temperature measuring elements of the post-installation temperature measuring unit during performing the heat treatment on the substrates to be treated in the treatment chamber, and the standard predicted temperature being predicted by using the standard simulation model.

4. The information processing system as claimed in claim 3, wherein the processor corrects the target temperature of first measured temperatures that is used to control the heater, based on the first measured temperatures, the second measured temperatures, and first individual predicted temperatures at positions between the plurality of temperature measuring elements of the post-installation temperature measuring unit, the first measured temperatures being respectively measured by the plurality of temperature measuring elements of the in-chamber temperature measuring unit during performing the heat treatment on the substrates to be treated in the treatment chamber, and the first individual predicted temperatures being predicted by using the individual simulation model.

5. The information processing system as claimed in claim 3, wherein the processor corrects the target temperature of first measured temperatures that is used to control the heater, based on the first measured temperatures, first individual predicted temperatures at positions between the plurality of temperature measuring elements of the post-installation temperature measuring unit, and second individual predicted temperatures at positions of the plurality of temperature measuring elements of the post-installation temperature measuring unit, the first measured temperatures being respectively measured by the plurality of temperature measuring elements of the in-chamber temperature measuring unit during performing the heat treatment on the substrates to be treated in the treatment chamber, and the first individual predicted temperatures and the second individual predicted temperatures being predicted by using the individual simulation model.

6. The information processing system as claimed in claim 1, wherein the processor repeats a process of modifying the standard simulation model to obtain the individual simulation model, based on a difference between the temperature distribution measured by the post-installation temperature measuring unit during performing the heat treatment on the substrates to be treated in the treatment chamber at the target temperature corrected based on the individual simulation temperature distribution and the obtained standard simulation temperature distribution at the corrected target temperature, until the difference is less than or equal to a predetermined value.

7. A temperature control method performed by an information processing system including a heater configured to heat substrates to be treated, a heat treatment apparatus configured to perform heat treatment on the substrates to be treated in a treatment chamber, and an information processing device configured to output a target temperature to be used to control the heater, the temperature control method comprising:

measuring a temperature distribution, in an array direction of the substrates to be treated, at positions between the heater and the substrates to be treated in the treatment chamber, during performing the heat treatment on the substrates to be treated in the treatment chamber;

performing a simulation of the temperature distribution during performing the heat treatment on the substrates to be treated in the treatment chamber, to obtain a standard simulation temperature distribution, by using a standard simulation model of the heat treatment apparatus;

modifying the standard simulation model to obtain an individual simulation model in which an individual difference of the heat treatment apparatus is reflected, based on a difference between the measured temperature distribution and the standard simulation temperature distribution obtained by the performing of the simulation;

performing a simulation of the temperature distribution during performing the heat treatment on the substrates to be treated in the treatment chamber to obtain an individual simulation temperature distribution, by using the individual simulation model, and controlling power supplied to the heater to increase or decrease an amount of heat generation of the heater so as to heat a wafer during a semiconductor manufacturing process, based on the obtained individual simulation temperature distribution, wherein each of the standard simulation model and the individual simulation model models how heat is exchanged in the heat treatment apparatus, the standard simulation temperature distribution is predicted using the standard simulation model, and the individual simulation temperature distribution is predicted using the individual simulation model.

8. A heat treatment apparatus configured to perform heat treatment on the substrates to be treated in a treatment chamber, the heat treatment apparatus comprising:

a heater configured to heat substrates to be treated in the treatment chamber;

a temperature measuring unit configured to measure a temperature distribution, in an array direction of the substrates to be treated, at positions between the heater and the substrates to be treated in the treatment chamber;

a memory; and a processor coupled to the memory and configured to:

perform a simulation of the temperature distribution during performing the heat treatment on the substrates to be treated in the treatment chamber, to obtain a standard simulation temperature distribution by using a standard simulation model of the heat treatment apparatus;

modify the standard simulation model to obtain an individual simulation model in which an individual difference of the heat treatment apparatus is reflected, based on a difference between the measured temperature distribution and the obtained standard simulation temperature distribution;

perform the simulation of the temperature distribution during performing the heat treatment on the substrates to be treated in the treatment chamber, to obtain an individual simulation temperature distribution by using the obtained individual simulation model; and control power supplied to the heater to increase or decrease an amount of heat generation of the heater so as to heat a wafer during a semiconductor manufacturing process, based on the obtained individual simulation temperature distribution, wherein each of the standard simulation model and the individual simulation model models how heat is exchanged in the heat treatment apparatus, the standard simulation temperature distribution is predicted using the standard simulation model, and the individual simulation temperature distribution is predicted using the individual simulation model.

* * * * *